(12) United States Patent
Yeomans et al.

(10) Patent No.: US 11,642,570 B2
(45) Date of Patent: May 9, 2023

(54) SWIMMING GOGGLE

(71) Applicant: adidas AG, Herzogenaurach (DE)

(72) Inventors: Deborah June Yeomans, Herzogenaurach (DE); Iain James Sabberton, Cambridge (GB); Simon Peter Wilsher, Letchworth (GB); Keir Samuel Jackson, Cumbria (GB); Oliver Nathaniel Ambrose Price, London (GB); Iain Martin Hannah, Nuremberg (DE); Marco Albert Dittrich, Adelsdorf (DE); Alain Walter, Herzogenaurach (DE); Jochen Suessmuth, Erlangen (DE)

(73) Assignee: adidas AG, Herzogenaurach (DE)

( * ) Notice: Subject to any disclaimer, the term of this patent is extended or adjusted under 35 U.S.C. 154(b) by 150 days.

(21) Appl. No.: 16/439,507

(22) Filed: Jun. 12, 2019

(65) Prior Publication Data

US 2019/0381361 A1    Dec. 19, 2019

(30) Foreign Application Priority Data

Jun. 14, 2018    (DE) .................... 10 2018 209 569.8

(51) Int. Cl.
| | |
|---|---|
| *G06T 19/20* | (2011.01) |
| *G06T 7/30* | (2017.01) |
| *A63B 33/00* | (2006.01) |
| *G06F 30/00* | (2020.01) |
| *G06T 17/20* | (2006.01) |
| *G06F 17/18* | (2006.01) |

(52) U.S. Cl.
CPC .......... *A63B 33/008* (2020.08); *A63B 33/004* (2020.08); *G06F 30/00* (2020.01); *G06T 7/30* (2017.01); *G06T 17/20* (2013.01); *G06T 19/20* (2013.01); *A63B 33/006* (2020.08); *G06F 17/18* (2013.01); *G06T 2219/2004* (2013.01)

(58) Field of Classification Search
None
See application file for complete search history.

(56) References Cited

U.S. PATENT DOCUMENTS

| | | | |
|---|---|---|---|
| 6,676,257 B2 | 1/2004 | Sheldon et al. | |
| 7,475,435 B2 | 1/2009 | Van Atta et al. | |
| 9,996,981 B1* | 6/2018 | Tran | G06K 9/4671 |
| 2005/0162419 A1* | 7/2005 | Kim | G06T 15/00 |
| | | | 382/199 |

(Continued)

FOREIGN PATENT DOCUMENTS

| | | |
|---|---|---|
| CN | 2890981 Y | 4/2007 |
| DE | 299 19 855 U1 | 2/2000 |

(Continued)

OTHER PUBLICATIONS

Extended European Search Report issued in European Patent Application No. 19179708.3, dated Oct. 30, 2019, 10 pages.

*Primary Examiner* — Yanna Wu
(74) *Attorney, Agent, or Firm* — Sterne, Kessler, Goldstein & Fox P.L.L.C.

(57) ABSTRACT

The present invention concerns a swimming goggle including at least one main body including: (a) an outer lens; (b) an inner lens; (c) a sealed gap separating the outer lens and the inner lens; and (d) an inner space arranged adjacent to the inner lens.

20 Claims, 3 Drawing Sheets

(56) References Cited

U.S. PATENT DOCUMENTS

| | | |
|---|---|---|
| 2013/0174333 A1 | 7/2013 | Schwartz |
| 2013/0309922 A1 | 11/2013 | Smith |
| 2015/0262405 A1* | 9/2015 | Black .................. G06T 7/97 |
| | | 345/420 |
| 2015/0335956 A1 | 11/2015 | DiChiara et al. |
| 2017/0065022 A1* | 3/2017 | Smith .................. A61B 5/1038 |
| 2017/0068774 A1* | 3/2017 | Cluckers .............. A61B 5/1036 |

FOREIGN PATENT DOCUMENTS

| | | |
|---|---|---|
| DE | 100 12 234 A1 | 9/2001 |
| DE | 10 2004 014 772 A1 | 10/2005 |
| GB | 2 284 679 A | 6/1995 |

\* cited by examiner

SWIMMING GOGGLE

TECHNICAL FIELD

The present invention relates to an improved swimming goggle and methods for production of the same.

PRIOR ART

Swimming goggles are commonly used by professional athletes and amateurs alike. They enable improved view and level of comfort when swimming or diving. An ideal swimming goggle should offer a low drag during swimming, be sealed well, such as to prevent water from entering, and not fog up during use.

A swimming goggle fogs up due to condensation on the inside of the lens. Thus, swimming goggles are known to employ an anti-fog agent, which may be a spray or a coating on the inside of the lens. However, such coatings may not be very effective and may have a short lifetime. For example, during continued use of a swimming goggle, the anti-fog agent may be washed off or scratched off from the lens and therefore cease to remain effective.

It is therefore an object of the present invention, to provide a swimming goggle that fogs up less easily than existing swimming goggles even after repeated use of the swimming goggle.

Another common problem of swimming goggles is that they may not seal sufficiently well and water may unintentionally enter the swimming goggles during use. This may lead to discomfort of the wearer and the wearer may have to slow down or stop his activity in order to clear the goggles off the water.

It is therefore a further object of the present invention, to provide a swimming goggle that has an improved seal compared with swimming goggles known in the art.

SUMMARY OF THE INVENTION

The first of these objects is accomplished by the teachings of the independent claims and in particular by a swimming goggle comprising at least one main body comprising:
(a) an outer lens; (b) an inner lens; (c) a sealed gap separating the outer lens and the inner lens; and (d) an inner space arranged adjacent to the inner lens.

A swimming goggle may be for swimming and/or diving. A lens is to be understood as any essentially transparent layer. A lens may correct a vision impairment of a wearer. However, it is also possible that the lens does not correct any vision impairment of a wearer.

The inner space is configured to be arranged between an eye of a wearer and the inner lens of the swimming goggle during normal usage of the swimming goggle.

The inventors have found that condensation on the inner lens is significantly reduced for a swimming goggle according to claim 1. Condensation occurs on an inner surface of the inner lens, if the temperature of the inner surface of the inner lens is below the dew point of water in the inner space. The outer lens and the sealed gap serve to thermally insulate the inner lens from the colder surroundings, in particular the water. Therefore, the inner lens is kept at a higher temperature and thus the amount of condensation on the inner surface of the inner lens can be reduced or condensation may even be prevented entirely.

The outer lens and/or the inner lens may comprise an anti-fog coating. An anti-fog coating may further reduce condensation. The anti-fog coating may, for example, comprise a surfactant.

Another benefit of using an outer lens and an inner lens is for the manufacturing process. In the prior art, lenses need to be sprayed during the goggle assembly procedure. The inventors have found, that by using an inner lens and an outer lens, the lenses can be dipped in solution in large batches (e.g. more than 100 lenses) and coated on both sides.

The inner lens and/or the outer lens may be laser-cut from a pre-coated sheet, which may be more cost effective and reduces production time. Optionally, a layer of anti-fog solution can be applied on the lenses to further enhance the effect.

The sealed gap may comprise a gas. The gas may have a reduced humidity. For example, the relative humidity at 20° C. of the gas may be less than 20%. This way, the dew point of any moisture in the gas in the sealed gap is below the temperature of the water commonly used for swimming in.

The gas may be air. It is particularly simple and cost-effective to incorporate air in the sealed gap.

The gas pressure inside the gap may be less than 100 mbar, preferably less than 50 mbar, most preferably less than 10 mbar. Heat transport is affected by conduction, convection, and radiation. The thermal conductivity of a gas generally decreases below about 100 mbar. A lower pressure also reduces the amount of convective heat transport. A reduced heat transport through the gas leads to a better thermal insulation of the inner lens and therefore a reduced level of condensation on the inner surface of the inner lens.

The gas may comprise an inert gas, in particular nitrogen or a noble gas. Inert gases have a low reactivity and thus facilitate a long life expectancy of the first lens and the second lens.

The inert gas may be argon. In the range wherein L>>lambda>>d, wherein L is the linear size of the system, lambda the mean free path of the molecules, and d the molecular diameter, the thermal conductivity $k \propto 1/(d^2 \sqrt{m})$, i.e. the greater the mass of the molecule, the smaller is the thermal conductivity. Therefore, in order of decreasing thermal conductivity, helium, neon, nitrogen ($N_2$), argon, krypton, and xenon may be used as the inert gas. Argon is advantageous due to its low thermal conductivity and relative abundance. Krypton provides an even lower thermal conductivity but is rarer than argon and more expensive.

The swimming goggle may further comprise at least one strap configured to secure the main body to the head of a wearer such that the inner space is arranged adjacent to the eye of the wearer. This allows a convenient way of securing the main body to the head. The strap may be elastic for a comfortable wearing experience. A length of the strap may be adjustable to provide an accurate fit for different sizes of heads.

The sealed gap may be sealed by a first seal, wherein the first seal may comprise a first thermal conductivity. For example, the first seal may comprise rubber or silicone, also known as polysiloxane. These materials have good sealing properties, are comfortable, and are non-toxic.

The swimming goggle may further comprise a second seal, wherein the second seal is configured to seal the inner space during use, and wherein the second seal comprises a second thermal conductivity. In other words, at least a part of the second seal is in contact with the skin of the wearer during normal use. The second seal may, for example, comprise rubber or silicone, also known as polysiloxane.

The second thermal conductivity may be greater than the first thermal conductivity. In other words, the second seal may conduct heat better than the first seal. Therefore, the heat transport between the skin of a wearer and the inner lens via the second seal is higher than the heat transport between the inner lens and the outer lens via the first seal. As a consequence, the inner lens is heated by the skin of the wearer whilst being well isolated from the colder outer lens, thus reducing the amount of condensation on the inner surface of the inner lens.

The second seal may comprise a fillet radius of between 1.5 and 2.5 mm, preferably between 1.75 mm and 2.25 mm. The second seal may comprise a contacting portion, configured to contact the skin of a wearer and an adjacent non-contacting portion, that is not configured to contact the skin of a wearer during use. A fillet radius is understood as the radius of a circle that defines a transition between the contacting portion and the non-contacting portion. For example, if the fillet radius is 0 mm, then the transition comprises an essentially right angle, meaning an angle between 70 and 110 degrees when the goggles are not worn and the second seal is undistorted. If the fillet radius is 2 mm, then the transition does not comprise a "sharp" essentially right angle, but instead is characterized by a circle of radius 2 mm, wherein the circle defines the shape of the second seal in the transition region between the contacting portion and the non-contacting portion. Through detailed modelling, the inventors have found, that this range of fillet radius creates the most even pressure distribution of the second seal on the eye socket and has the lowest peak contact pressure. Therefore, this parameter range provides an optimal level of comfort and sealing efficacy.

The second seal may comprise a flange angle of between 30 and 60 degrees. The flange angle is determined in a rim portion of the second seal, for example proximate a nose bridge but the flange angle may generally refer to any position on the rim portion of the second seal. The swimming goggle is matched to fit a model head. The surface of the model head defines a flange angle of 0 degrees for the second seal. The flange angle is defined as the angle between the model head and a rim portion of the second seal, when the goggles are not worn but are aligned to be worn by the model head. At a flange angle of 60 degrees, the rim portion of the second seal may be parallel to the outer lens of the goggle. A lower flange angles represents a tilt of the second seal, wherein the outer rim portion is tilted away from the head of the wearer, i.e. outwards. Through detailed modelling, the inventors have found, that this range of flange angle creates the most even pressure distribution of the second seal on the eye socket and has the lowest peak contact pressure. Therefore, this parameter range provides an optimal level of comfort and sealing efficacy.

The main body may comprise a condensation portion comprising a third thermal conductivity that is higher than the first thermal conductivity. The condensation portion may be in contact with the water during normal use. Therefore, the condensation portion will be cooled by the surrounding water. The condensation portion may be at least partially arranged in the inner space. Therefore, the condensation portion preferentially allows the condensation of moisture on the condensation portion, thus reducing the relative humidity in the inner space and the amount of condensation on the inner surface of the inner lens. For example, the condensation portion may comprise a metal, for example aluminium or stainless steel.

The outer lens may have a first thickness and the inner lens may have a second thickness, and the first thickness may be greater than the second thickness. The outer lens is exposed to greater wear and tear than the inner lens and therefore is preferably thicker than the inner lens to provide enhanced durability.

Moreover, generally, the heat current J through an area A, for a temperature difference $\Delta T$ over a thickness l, is approximately given by $$J = \frac{Ak\Delta T}{l}$$

wherein k is the thermal conductivity. Thus, a greater thickness leads to a lower heat current. Therefore, the thermal insulation of the inner lens from the water is improved by a thicker outer lens, thus reducing the amount of condensation on the inner surface of the inner lens.

The sealed gap may have a third thickness of at least 0.5 mm, preferably 1 mm, more preferably 2 mm. A third thickness is the distance between the outer lens and the inner lens at a given position. The third thickness may be essentially constant, i.e. the spacing between the outer lens and the inner lens may be essentially constant. Essentially constant means, in this context, constant within 10% to allow for manufacturing tolerances. However, it is also possible that the spacing between the outer lens and the inner lens is variable.

The greater the third thickness, the better is the thermal insulation of the inner lens. However, if the third thickness is too large, the main body becomes unstable and the drag of the swimming goggle during swimming is increased. The inventors have found that the given range provides a preferable balance between thermal insulation on one hand and stability and drag on the other hand.

The swimming goggle may comprise two main bodies connected by a nose bridge. Each of the two main bodies may be for each eye of a wearer. This design allows two smaller main bodies to be used rather than a single large main body. Consequently, the drag of the swimming goggle during swimming is reduced. However, it is also possible that the swimming goggle has a single main body or three or more main bodies.

A length of the nose bridge may be adjustable. Therefore, the length of the nose bridge can be adjusted to the width of the wearer's nose, allowing an optimal and individual fit.

The inner lens may further comprise an infrared-reflective coating. An infrared-reflective coating in the present context is any coating that preferentially reflects light in the infrared range compared to the visible range. In other words, the reflectivity is higher than in the visible range. This is sometimes also referred to as low emissivity coating. The infrared-reflective coating may have an emissivity in the infrared of less than 0.2, preferably less than 0.1. The infrared-reflective coating may be applied on an inside of the inner lens or an outside of the inner lens. A suitable coating may comprise a thin metal-oxide film comprising, for example, silver, aluminium, or tin dioxide.

The inner lens and/or the outer lens may comprise a polarization filter. For example, the polarization filter may preferentially transmit horizontally polarized light. Therefore, uncomfortable reflections of light on an air-water interface may be reduced. Alternatively, the polarization filter may preferentially transmit vertically polarized light. Therefore, the intensity of light transmitted through an air-water interface may be reduced, such that a submerged swimmer may be able to see more clearly.

The outer lens and/or the inner lens may comprise a polycarbonate. Polycarbonates are durable, scratch-resistant, and highly transparent to visible light. Polycarbonates are therefore ideally suited for a lens.

The inner lens and/or the outer lens may be replaceable. For example, the inner lens and/or the outer lens may be attached by means of at least one screw and/or a clamping mechanism to the main body. By providing a replaceable inner and/or outer lens, it is possible to replace a damaged inner and/or outer lens, or to use a custom inner and/or outer lens, for example a prescription lens to correct a vision impairment.

The swimming goggle may further comprise a heat source, thermally coupled to the inner lens. The heat source may comprise a battery. Therefore, it is possible to heat the inner lens and thus further reduce the amount of condensation or even completely prevent any condensation on the inner surface of the inner lens.

The invention further concerns a method of producing a swimming goggle comprising providing at least one main body, comprising: (a) providing an outer lens; (b) providing an inner lens; (c) arranging the outer lens and the inner lens such as to create a gap separating the outer lens and the inner lens and sealing the gap; and (d) providing an inner space arranged adjacent to the inner lens.

The advantages provided by this method are analogous to those of the swimming goggle described herein.

The method may further comprise applying an anti-fog coating to the outer lens and/or the inner lens. The anti-fog coating may further reduce condensation. The anti-fog coating may, for example, comprise a surfactant.

Applying the anti-fog coating may comprise dipping the inner lens and/or outer lens in solution, which advantageously can be performed in large batches (e.g. more than 100 lenses).

The method may, additional or alternatively comprise cutting, for example laser cutting, the inner lens and/or the outer lens from a pre-coated sheet. This may be more cost effective and reduce production time. Optionally, a layer of anti-fog solution can be applied on the lenses for further enhance the effect.

The method of producing a swimming goggle may further comprise filling the sealed gap with a gas. The gas may have a reduced humidity. For example, the relative humidity at 20° C. of the gas may be less than 20%. This way, the dew point of any moisture in the gas in the sealed gap is below the temperature of the water commonly used for swimming in.

The gas may be air. It is particularly simple and cost-effective to incorporate air in the sealed gap.

The method of producing a swimming goggle may further comprise providing a gas pressure inside the gap of less than 100 mbar, preferably less than 50 mbar, most preferably less than 10 mbar. For example, the gas may be filled into the gap inside a low-pressure chamber evacuated to the desired target pressure. This allows a reduced heat transport through the gas, which leads to a better thermal insulation of the inner lens and therefore a reduced level of condensation on the inner surface of the inner lens, as described herein.

The gas may comprise an inert gas, in particular nitrogen or a noble gas. Inert gases have a low reactivity and thus facilitate a long life expectancy of the first lens and the second lens.

The inert gas may be argon. In the range wherein L>>lambda>>d, wherein L is the linear size of the system, lambda the mean free path of the molecules, and d the molecular diameter, the thermal conductivity $k \propto 1/(d^2\sqrt{m})$, i.e. the greater the mass of the molecule, the smaller is the thermal conductivity. Therefore, in order of decreasing thermal conductivity, helium, neon, nitrogen ($N_2$), argon, krypton, and xenon may be used as the inert gas. Argon is advantageous due to its low thermal conductivity and relative abundance. Krypton provides an even lower thermal conductivity but is rarer than argon and more expensive.

The method of producing a swimming goggle may further comprise providing at least one strap configured to secure the main body to the head of a wearer such that the inner space is arranged adjacent to the eye of the wearer. This allows a convenient way of securing the main body to the head. The strap may be elastic for a comfortable wearing experience. A length of the strap may be adjustable to provide an accurate fit for different sizes of heads.

Sealing the gap may comprise providing a first seal to seal the gap, and the first seal may comprise a first thermal conductivity. For example, the first seal may comprise rubber or silicone, also known as polysiloxane. These materials have good sealing properties, are comfortable, and are non-toxic.

The method of producing a swimming goggle may further comprise providing a second seal, wherein the second seal is configured to seal the inner space during use, and wherein the second seal comprises a second thermal conductivity.

The second thermal conductivity may be greater than the first thermal conductivity. In other words, the second seal may conduct heat better than the first seal. Therefore, the heat transport between the skin of a wearer and the inner lens via the second seal is higher than the heat transport between the inner lens and the outer lens via the first seal. As a consequence, the inner lens is heated by the skin of the wearer whilst being well isolated from the colder outer lens, thus reducing the amount of condensation on the inner surface of the inner lens.

The second seal may comprise a fillet radius of between 1.5 and 2.5 mm. It has already been described how the term fillet radius is to be understood. Through detailed modelling, the inventors have found, that this range of fillet radius creates the most even pressure distribution of the second seal on the eye socket and has the lowest peak contact pressure. Therefore, this parameter range provides an optimal level of comfort and sealing efficacy.

The second seal may comprise a flange angle of between 30 and 60 degrees. It has already been described how the term flange angle is to be understood. Through detailed modelling, the inventors have found, that this range of flange angle creates the most even pressure distribution of the second seal on the eye socket and has the lowest peak contact pressure. Therefore, this parameter range provides an optimal level of comfort and sealing efficacy.

The main body may comprise a condensation portion comprising a third thermal conductivity that may be higher than the first thermal conductivity. The condensation portion may be in contact with the water during normal use. Therefore, the condensation portion will be cooled by the surrounding water. The condensation portion may be at least partially arranged in the inner space. Therefore, the condensation portion preferentially allows the condensation of moisture on the condensation portion, thus reducing the relative humidity in the inner space and the amount of condensation on the inner surface of the inner lens. For example, the condensation portion may comprise a metal, for example aluminium or stainless steel.

The outer lens may have first thickness and the inner lens has a second thickness, and wherein the first thickness is greater than the second thickness. The outer lens is exposed to greater wear and tear than the inner lens and therefore is preferably thicker than the inner lens to provide enhanced durability. Moreover, the thermal insulation of the inner lens from the water is improved by a thicker outer lens, thus reducing the amount of condensation on the inner surface of the inner lens, as described herein.

The gap may have a third thickness of at least 0.5 mm, preferably 1 mm, more preferably 2 mm. A third thickness is the distance between the outer lens and the inner lens at a given position. The third thickness may be essentially constant, i.e. the spacing between the outer lens and the inner lens may be essentially constant. Essentially constant means in this context, constant within 10% to allow for manufacturing tolerances. However, it is also possible that the spacing between the outer lens and the inner lens is variable.

Producing the swimming goggle may comprise providing two main bodies and connecting the two main bodies by a nose bridge. Each of the two main bodies may be for each eye of a wearer. This design allows two smaller main bodies to be used rather than a single large main body. Consequently, the drag of the swimming goggle during swimming is reduced. However, it is also possible that the swimming goggle has a single main body or three or more main bodies.

A length of the nose bridge may be adjustable. Therefore, the length of the nose bridge can be adjusted to the width of the wearer's nose, allowing an optimal and individual fit.

The method of producing a swimming goggle may further comprise applying an infrared-reflective coating on the inner lens. An infrared-reflective coating in the present context is any coating that preferentially reflects light in the infrared range compared to the visible range. In other words, the reflectivity is higher than in the visible range. This is sometimes also referred to as low emissivity coating. The infrared-reflective coating may have an emissivity in the infrared of less than 0.2, preferably less than 0.1. The infrared-reflective coating may be applied on an inside of the inner lens or an outside of the inner lens. A suitable coating may comprise a thin metal-oxide film comprising, for example, silver, aluminium, or tin dioxide. The application may comprise chemical vapor deposition and/or magnetron sputtering.

The inner lens and/or the outer lens may comprise a polarization filter. For example, the polarization filter may preferentially transmit horizontally polarized light. Therefore, uncomfortable reflections of light on an air-water interface may be reduced. Alternatively, the polarization filter may preferentially transmit vertically polarized light. Therefore, the intensity of light transmitted through an air-water interface may be reduced, such that a submerged swimmer may be able to see more clearly.

The outer lens and/or the inner lens may comprise a polycarbonate. Polycarbonates are durable, scratch-resistant, and highly transparent to visible light. Polycarbonates are therefore ideally suited for a lens.

The inner lens and/or the outer lens may be replaceable. For example, the inner lens and/or the outer lens may be attached by means of at least one screw and/or a clamping mechanism to the main body. By providing a replaceable inner and/or outer lens, it is possible to replace a damaged inner and/or outer lens, or to use a custom inner and/or outer lens, for example a prescription lens to correct a vision impairment.

The method of producing a swimming goggle may further comprise: providing at least one heat source and thermally coupling the heat source to the inner lens. The heat source may comprise a battery. Therefore, it is possible to heat the inner lens and thus further reduce the amount of condensation or even completely prevent any condensation on the inner surface of the inner lens.

The method of producing a swimming goggle may further comprise:
(e) scanning a head of at least one person;
(f) creating a digital model of the head;
(g) creating a digital model of the swimming goggle;
(h) digitally arranging the digital model of the swimming goggle on the digital model of the head;
(i) adjusting the digital model of the swimming goggle to achieve an optimal fit to the digital model of the head; and
(j) producing a swimming goggle based on the adjusted digital model of the swimming goggle.

Scanning a head may comprise using optical means, for example a camera, a stereo-camera system, a structured light scanning, or laser scanning, in order to create a three-dimensional digital model of the head. One example is using ARTEC 3D EVA. This method allows ideally fitting the design of the swimming goggle to the individual requirements of a swimmer. In particular, this allows a customised seal profile for the first seal and/or the second seal to be constructed. A good fit of the second seal is particularly important to ensure that the swimming goggles do not leak.

The scan of the head may be performed for at least two persons and the digital model of the head may be based on a digital average of the scans for the two persons. Therefore, it is possible to provide a swimming goggle that fits well for a group of people, for example a group of professional athletes that may share certain common facial features.

In order to provide an optimal fit of the swimming goggle for a group of swimmers, there is a need to understand the anatomy of the swimmers' heads and in particular the eye sockets. This may be achieved by generating an average head model of the swimmers and fitting the swimming goggle on the model to find the optimal fit.

Therefore, the method of producing a swimming goggle may comprise a non-rigid registration process, which digitally applies a common template mesh to all head scan instances and obtains a set of meshes corresponding to the multiple head scans. Each mesh of the set of meshes has the same topology and number of vertices but with a different geometry and shape corresponding to the respective original scan. The set of meshes then allows to directly and easily compare the head scans and to perform statistical operations such as computation of averages or standard deviations. An average model of the multiple head scans can thus be generated. Alternatively, any suitable method for generating a 3D geometry may be used here.

A digital model of a swimming goggle may then be loaded with the average model of the head scans, and the optimal placement of the swimming goggle may then be computed with respect to the average model of the head. Particularly, a distance between the inner lens of the swimming goggle and the eye on the head model may be optimized to an acceptable minimum distance. Several local minima can be calculated and acquired. The optimal position of the inner lens with respect to the eyes on the head is then decided and may be chosen as the one with the best alignment with the line of sight for the average head model. An optimized geometry of the swimming goggle and in particular the second seal is then selected depending on the chosen position of the inner lens.

The invention further concerns a method of producing a sports article comprising:
(a) scanning a body part of at least one person;
(b) creating a digital model of the body part;

(c) creating a digital model of the sports article;
(d) digitally arranging the digital model of the sports article on the digital model of the body part;
(e) adjusting the digital model of the sports article to achieve an optimal fit to the digital model of the body part; and
(f) producing the sports article based on the adjusted digital model of the sports article.

This method addresses the object to provide a sport article that has an improved seal as mentioned above and allows ideally fitting the design of a sports article to the individual requirements of an athlete. The sports article may be a swimming goggle, for example as described herein, and the body part may be a head.

SHORT DESCRIPTION OF THE FIGURES

In the following, exemplary embodiments of the invention are described with reference to the figures.

DETAILED DESCRIPTION OF PREFERRED EMBODIMENTS

In the following some embodiments of the invention are described in detail. It is to be understood that these exemplary embodiments can be modified in a number of ways and combined with each other whenever compatible and that certain features may be omitted in so far as they appear dispensable.

Figure 1A:
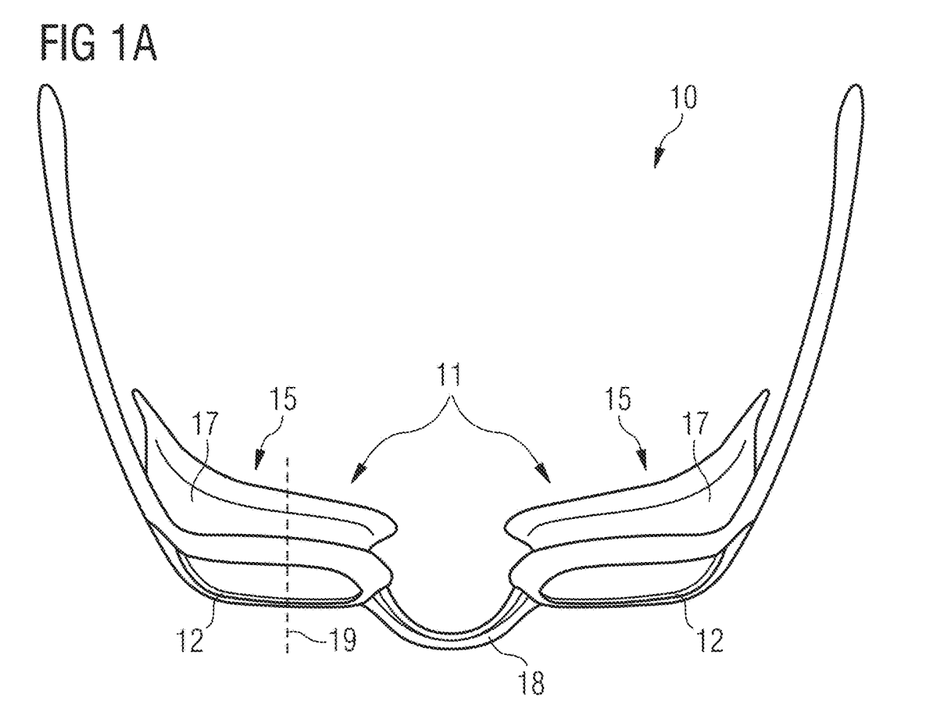
FIG. 1A: shows a top view of an exemplary swimming goggle according to the present invention.
Figure 1B:
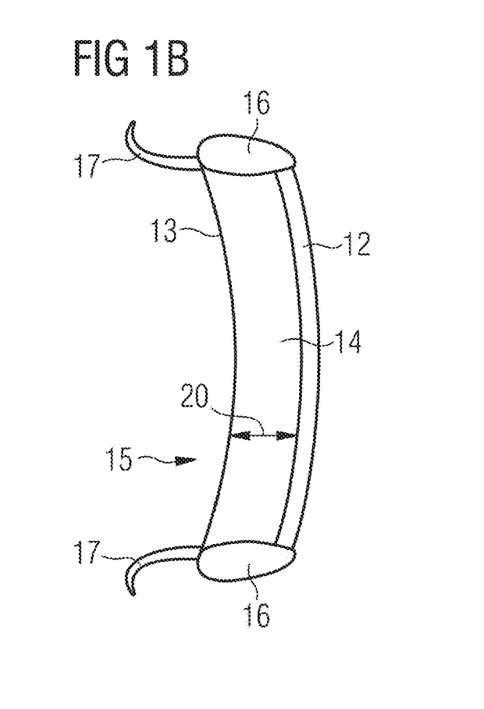
FIG. 1B: shows a cross-section of the exemplary swimming goggle of FIG. 1A.
Figure 1C:
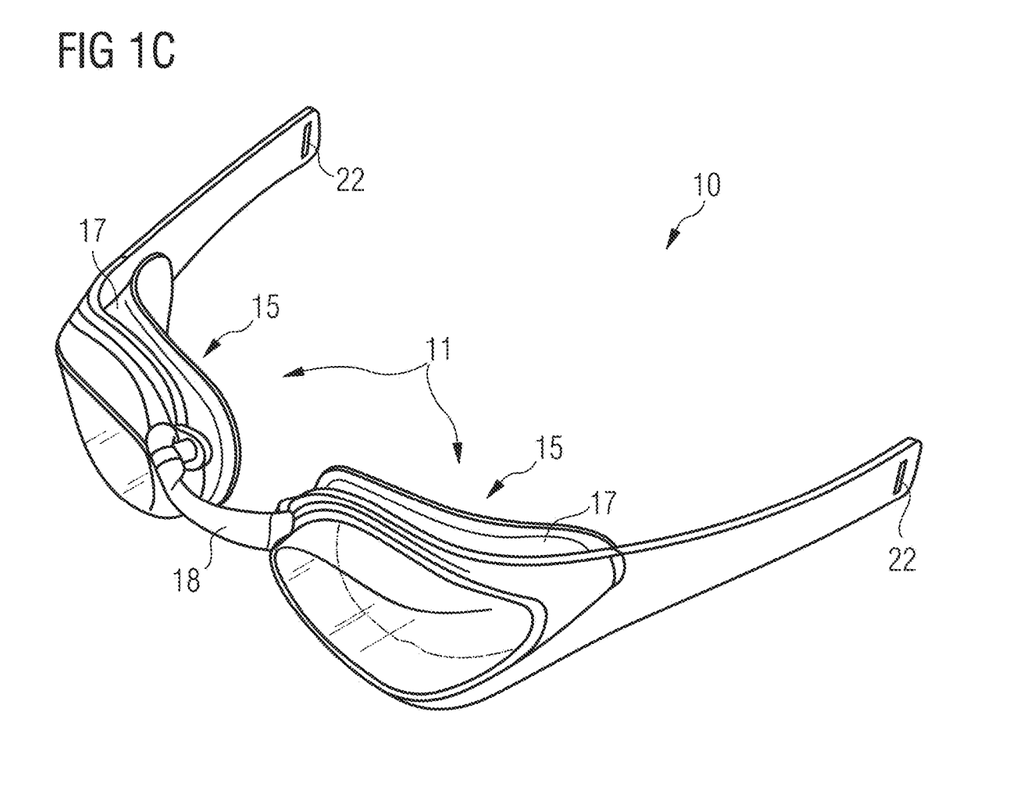
FIG. 1C: shows a lateral top view of the exemplary swimming goggle of FIG. 1A.

FIGS. 1A-C show a swimming goggle 10 comprising at least one main body 11 comprising: (a) an outer lens 12; (b) an inner lens 13; (c) a sealed gap 14 separating the outer lens 12 and the inner lens 13; and (d) an inner space 15 arranged adjacent to the inner lens 13.

FIG. 1A shows a top view, FIG. 1B shows a cross-sectional cut along the line 19 indicated in FIG. 1A, and FIG. 1C shows a lateral top view.

The inner space 15 is configured to be arranged between an eye of a wearer and the inner lens 13 during normal usage of the swimming goggle 10.

The sealed gap 14 comprises a gas. The gas has a reduced humidity. The relative humidity at 20° C. of the gas is less than 1%.

The gas comprises an inert gas. The inert gas in this example is argon, which has a low thermal conductivity. However, it is also possible to use other gases and in particular it is also possible to use air.

The swimming goggle 10 is intended to comprise a strap (not shown) configured to secure the main body 11 to the head of a wearer such that the inner space 15 is arranged adjacent to the eye of the wearer. The strap will be attached at an attachment point 22, which in this case is a slit, on the left main body 11 and the right main body 11.

As shown in FIG. 1B, the sealed gap 14 is sealed by a first seal 16, which comprises a first thermal conductivity. In this example, the first seal 16 comprises silicone, also known as polysiloxane.

The swimming goggle 10 further comprises a second seal 17, which is configured to seal the inner space 15 during use, and which comprises a second thermal conductivity. At least a part of the second seal 17 is in contact with the skin of the wearer during normal use. The second seal 17 also comprises silicone, also known as polysiloxane.

The second thermal conductivity of the second seal 16 is greater than the first thermal conductivity of the first seal 17. In other words, the second seal 17 may conduct heat better than the first seal 16. Therefore, the heat transport between the skin of a wearer and the inner lens 13 via the second seal 17 is higher than the heat transport between the inner lens 13 and the outer lens 12 via the first seal 16. As a consequence, the inner lens 13 is heated by the skin of the wearer whilst being well isolated from the colder outer lens 12, thus reducing the amount of condensation on the inner surface of the inner lens 13.

The second seal 17 may comprise a fillet radius of between 2 mm and a flange angle of between 45 degrees.

This exemplary main body 11 does not comprise a condensation portion comprising a third thermal conductivity that is higher than the first thermal conductivity. However, other embodiments may comprise such a condensation portion, which may be in contact with the water during normal use. Such a condensation portion may for example be made of a material with a high thermal conductivity, such as metal, and conduct heat from the inner space 15 to the outside, such that the dew point of the air in the inner space 15 is reached in the vicinity of the condensation portion.

The exemplary outer lens 12 has a first thickness of 2 mm and the inner lens 13 has a second thickness of 1 mm. The outer lens 12 is exposed to greater wear and tear than the inner lens 13 and therefore is preferably thicker than the inner lens 13 to provide enhanced durability. However, in other embodiments, different thicknesses may be used.

The gap has a third thickness 20 of 2 mm. A third thickness 20 is the distance between the outer lens 12 and the inner lens 13 at a given position. In this example, the third thickness 20 is essentially constant, i.e. the spacing between the outer lens 12 and the inner lens 13 is essentially constant. Essentially constant means in this context, constant within 10% to allow for manufacturing tolerances. However, it is also possible that the spacing between the outer lens 12 and the inner lens 13 is variable.

The exemplary swimming goggle 10 comprises two main bodies 11 connected by a nose bridge 18. Each of the two main bodes 11 is for each eye of a wearer. In this example, the length of the nose bridge 18 is not adjustable. However, it is possible that the length of the nose bridge 18 is adjustable.

The inner lens 13 further comprises an infrared-reflective coating. An infrared-reflective coating in the present context is any coating that preferentially reflects light in the infrared range compared to the visible range. In other words, the reflectivity is higher than in the visible range. This is sometimes also referred to as low emissivity coating. The exemplary infrared-reflective coating has an emissivity in the infrared, e.g. at 1000 nm wavelength, of less than 0.1. The infrared-reflective coating is applied on an outside of the inner lens 13. The coating comprises a thin metal-oxide film comprising fluorine-doped tin dioxide.

In this example, the inner lens 13 comprises a polarization filter. The polarization filter preferentially transmits horizontally polarized light. Therefore, uncomfortable reflections of light on an air-water interface are reduced. However, alternatively, the polarization filter may preferentially transmit vertically polarized light.

The outer lens 12 and the inner lens 13 comprise a polycarbonate and the inner lens 13 and the outer lens 12 are replaceable.

The exemplary swimming goggle 10 does not comprise a heat source, that is thermally coupled to the inner lens 13. However, it is possible that the swimming goggle 10 comprises a heat source.

Figure 2:
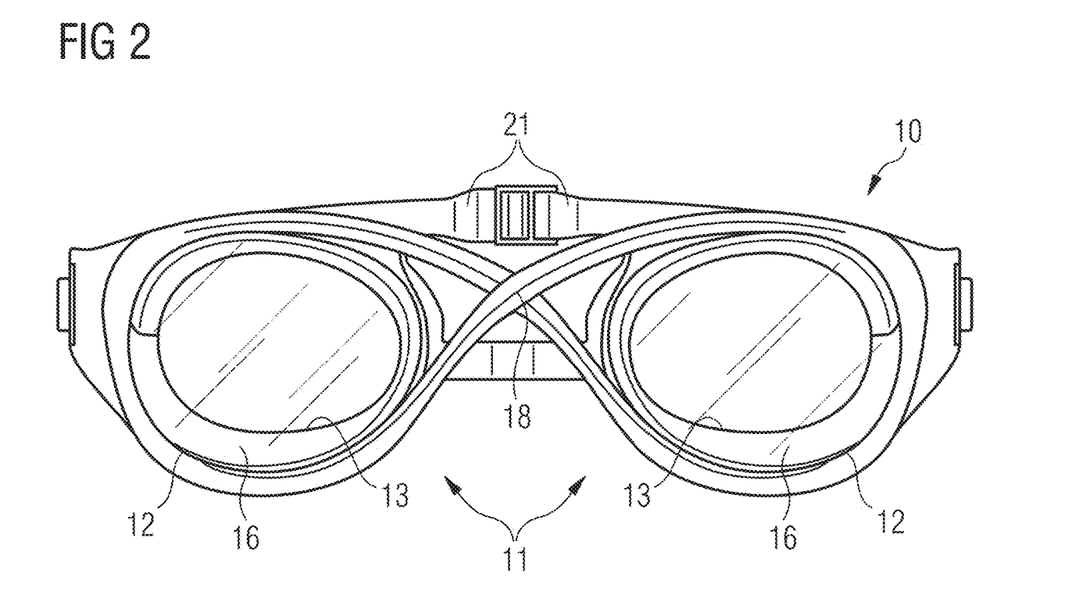
FIG. 2: shows another exemplary swimming goggle according to the present invention.

FIG. 2 shows another exemplary swimming goggle 10 comprising at least one main body 11 comprising: (a) an outer lens 12; (b) an inner lens 13; (c) a sealed gap 14 separating the outer lens 12 and the inner lens 13; and (d) an inner space 15 arranged adjacent to the inner lens 13.

The swimming goggle 10 comprises a strap 21 configured to secure the main body 11 to the head of a wearer such that the inner space 15 is arranged adjacent to the eye of the wearer. The strap 21 is attached at an attachment point (not shown) on the left main body 11 and the right main body 11.

The sealed gap 14 comprises a gas. The gas has a reduced humidity, in this example, the relative humidity at 20° C. of the gas is less than 2%. In this example, the gas is air and the gas pressure inside the gap is less than 10 mbar to reduce the heat transport through the gas and effect a better thermal insulation of the inner lens 13 and therefore a reduced level of condensation on the inner surface of the inner lens 13.

The swimming goggle 10 comprises two main bodies 11, one for each eye of a wearer, connected by a nose bridge 18. In this example, the nose bridge 18 has an X-shape, thus increasing the stability of the swimming goggle 10.

The swimming goggle 10 of FIGS. 1A-C and 2 may be produced by a method of producing a swimming goggle 10 comprising: (a) scanning a head of at least one person; (b) creating a digital model of the head; (c) creating a digital model of the swimming goggle 10; (d) digitally arranging the digital model of the swimming goggle 10 on the digital model of the head; (e) adjusting the digital model of the swimming goggle 10 to achieve an optimal fit to the digital model of the head; and (f) producing a swimming goggle 10 based on the adjusted digital model of the swimming goggle 10.

In this example, scanning a head comprises optical means, for example a camera, or a stereo-camera system in order to create a three-dimensional digital model of the head. This method allows ideally fitting the design of the swimming goggle 10 to the individual requirements of a swimmer.

In this example, the scan of the head was performed for at least two persons and the digital model of the head was based on a digital average of the scans for the two persons. Therefore, it is possible to provide a swimming goggle 10 that fits well for a group of people, for example a group of professional athletes that may share certain common facial features.

In order to provide an optimal fit of the swimming goggle for a group of swimmers, there is a need to understand the geometry of the swimmers' heads and in particular of the eye sockets. This may be achieved by generating an average head model of the swimmers and fitting the swimming goggle on the model to find the optimal fit.

In this example, this comprises scanning the head of multiple swimmers and performing a statistical analysis of the head scans. A non-rigid registration process is used, which digitally applies a common template mesh to all head scan instances and a set of meshes corresponding to the multiple head scans is obtained. Each mesh of the set of meshes has the same topology and number of vertices but with a different geometry and shape corresponding to the respective original scan. The set of meshes then allows to directly and easily compare the head scans and to perform statistical operations such as computation of averages or standard deviations. An average model of the multiple head scans can thus be generated. Alternatively, any suitable method for generating a 3D geometry may be used here.

In this example, a digital model of a swimming goggle is then loaded with the average model of the head scans, and the optimal placement of the swimming goggle is then computed with respect to the average model of the head. Particularly, a distance between the inner lens of the swimming goggle and the eye on the head model is optimized to an acceptable minimum distance. Several local minima can be calculated and acquired. The optimal position of the inner lens with respect to the eyes on the head is then decided and chosen as the one with best alignment with the line of sight for the average head model. An optimized geometry of the swimming goggle and in particular the second seal is then selected depending on the chosen position of the inner lens.

Figure 3A:
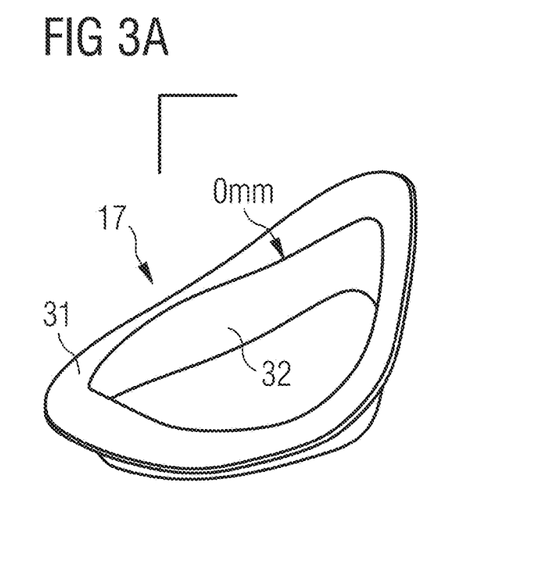
FIG. 3A: illustrates a fillet radius of a second seal according to the present invention.

FIG. 3A shows an exemplary second seal 17 with a fillet radius of 0 mm. The exemplary second seal 17 comprises a contacting portion 31, configured to contact the skin of a wearer during use and a non-contacting portion 32, that is not configured to contact the skin of a wearer during use. The fillet radius is understood as the radius of a circle that defines a transition between the contacting portion 31 and the non-contacting portion 32. In this example, the fillet radius is 0 mm, i.e. the transition comprises an essentially right angle, meaning an angle between 70 and 110 degrees, as indicated at the top of the figure, when the goggles are not worn and the second seal 17 is undistorted.

Figure 3B:
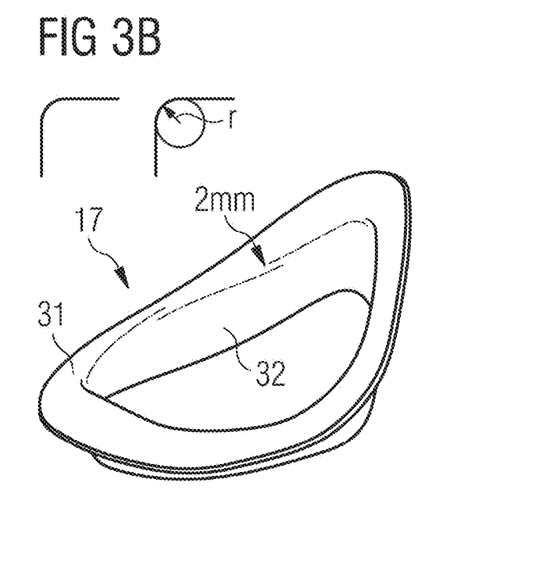
FIG. 3B: illustrates additional fillet radii of a second seal according to the present invention.

FIG. 3B shows another exemplary second seal 17 with a fillet radius of 2 mm. The transition between the contacting portion 31 and the non-contacting portion 32 does not comprise a "sharp" essentially right angle, but instead is characterized by a circle of radius 2 mm, wherein the circle defines the shape of the second seal 17 in the transition region between the contacting portion and the non-contacting portion. This is indicated at the top of figure.

Figure 4:
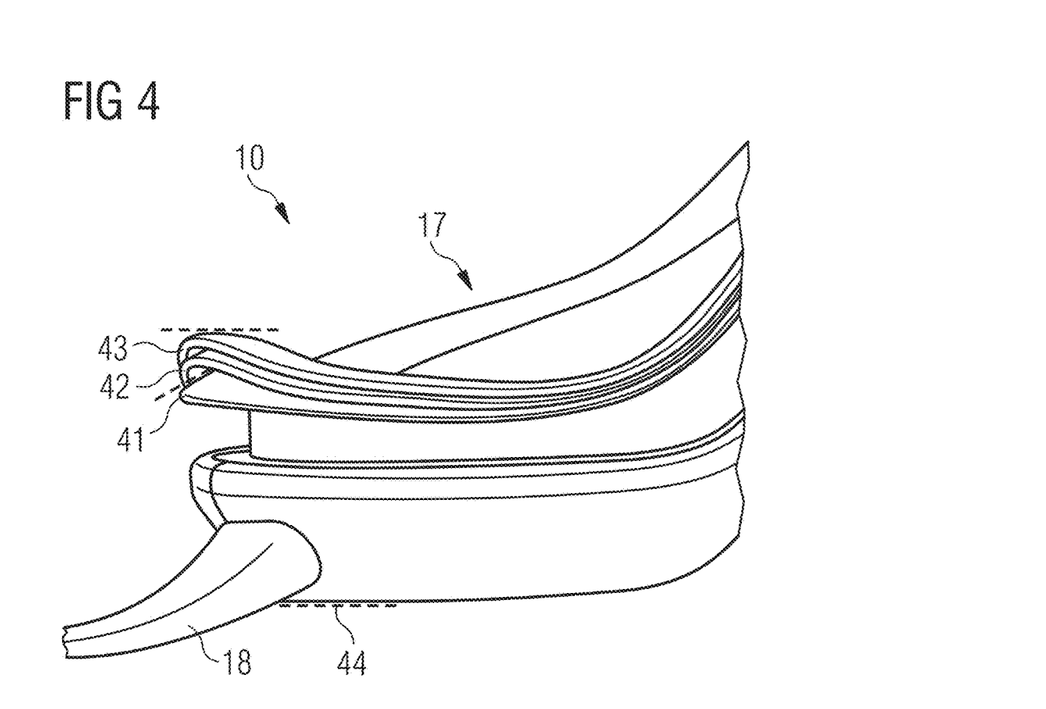
FIG. 4: illustrates flange angles of a second seal.

FIG. 4 shows a collapsed illustrative figure of an exemplary swimming goggle 10 comprising a second seal 17 according to three different options of the flange angle.

The swimming goggle 10 is matched to fit a model head and comprises a nose bridge 18. The surface of the model head defines a flange angle of 0 degrees for the second seal. A second seal with a flange angle of 0 degrees is indicated by reference numeral 41. The flange angle is defined as the angle between the model head and a rim portion of the second seal, when the goggles are not worn but are aligned to be worn by the model head. A second seal with a flange angle of 30 degrees is indicated by reference numeral 42. A second seal with a flange angle of 60 degrees is indicated by reference numeral 43.

At the third flange angle 43 of 60 degrees, the rim portion of the second seal is parallel to the outer surface 44 of the outer lens of the goggle 10. A lower flange angle represents a tilt of the second seal, wherein the outer rim portion is tilted away from the head of the wearer, i.e. outwards.

REFERENCE SIGNS

10: swimming goggle
11: main body
12: outer lens
13: inner lens

14: sealed gap
15: inner space
16: first seal
17: second seal
18: nose bridge
19: cross-sectional cut direction
20: third thickness
21: strap
22: attachment point
31: contacting portion
32: non-contacting portion
41: second seal with first flange angle
42: second seal with second flange angle
43: second seal with third flange angle
44: outer surface of outer lens

What is claimed is:

1. A method of producing a sports article for use in an athletic activity, comprising:
scanning a body part of at least one person, wherein the body part includes an eye socket;
creating a digital model of the body part in a digital environment;
creating a digital model of the sports article in the digital environment, the digital model of the sports article comprising a seal that includes a first portion configured to contact the body part and a second portion adjacent to the first portion and configured to not contact the body part;
digitally arranging the digital model of the sports article on the digital model of the body part in the digital environment;
adjusting the digital model of the sports article in the digital environment to fit to the digital model of the body part by selecting an optimized geometry of the sports article, wherein the optimized geometry comprises a curved transition region between the first portion and the second portion of the digital model of the sports article and the adjusting includes altering the optimized geometry so that the seal has a fillet radius between 1.5 and 2.5 mm or a flange angle between 30 and 60 degrees to create an even pressure distribution of the seal on the eye socket; and
producing the sports article based on the adjusted digital model of the sports article.

2. The method according to claim 1, wherein the body part is a head and the sports article is a swimming goggle.

3. The method according to claim 2, wherein producing the swimming goggle comprises:
(a) providing an outer lens;
(b) providing an inner lens;
(c) arranging the outer lens and the inner lens such as to create a gap separating the outer lens and the inner lens and sealing the gap; and
(d) providing an inner space arranged adjacent to the inner lens.

4. The method according to claim 3, further comprising filling the sealed gap with a gas and providing a gas pressure inside the sealed gap of less than 100 mbar.

5. The method according to claim 3, wherein sealing the gap comprises providing a first seal to seal the gap and wherein the method further comprises providing a second seal to seal the inner space during use, wherein the first seal comprises a first thermal conductivity and the second seal comprises a second thermal conductivity, wherein the second thermal conductivity is greater than the first thermal conductivity.

6. The method according to claim 3, wherein the outer lens has a first thickness and the inner lens has a second thickness, and wherein the first thickness is greater than the second thickness.

7. The method according to claim 3, further comprising applying an infrared-reflective coating on the inner lens.

8. The method according to claim 3, wherein the inner lens and/or the outer lens is replaceable.

9. The method of producing a sports article according to claim 1, wherein scanning the body part is performed for at least two persons and the digital model of the body part is based on a digital average of the scans for the two persons.

10. The method according to claim 9, further comprising performing a statistical analysis of the body part scans.

11. The method according to claim 10, further comprising a non-rigid registration process, which digitally applies a common template mesh to all body part scan instances to obtain a set of meshes corresponding to the multiple body part scans.

12. The method according to claim 1, wherein scanning the body part comprises using an optical means.

13. The method according to claim 12, wherein scanning the body part comprises using a stereo-camera system.

14. A sports article for use in an athletic activity produced by a method according to claim 1.

15. A method of producing a sports article for use in an athletic activity, comprising:
creating a digital model of a body part in a digital environment, wherein the body part includes an eye socket;
creating a digital model of the sports article in the digital environment, wherein the digital model of the sports article includes a digital model of a seal for the eye socket;
determining a distance between a part of the digital model of the body part and a part of the digital model of the sports article;
adjusting the digital model of the sports article in the digital environment to align a centerline of sight for the part of the digital model of the body part with the part of the digital model of the sports article based on the determined distance and so that the seal has a fillet radius between 1.5 and 2.5 mm or a flange angle between 30 and 60 degrees to create an even pressure distribution of the seal on the eye socket;
selecting an optimized geometry of the part of the digital model of the sports article based on the adjusted digital model of the sports article in the digital environment; and
producing the sports article based on the adjusted digital model of the sports article and the selected optimized geometry of the part of the digital model of the sports article.

16. The method according to claim 15, wherein a center of the part of the digital model of the sports article is aligned with a center of a corresponding part of the digital model of the body part.

17. The method according to claim 15, further comprising:
adjusting a length of a second part of the digital model of the sports article relative to the part of the digital model of the body part, the length adjusted based on a dimension of a second part of the digital model of the body part.

18. The method according to claim 15, further comprising:

determining a distance between the part of the digital model of the body part and a second part of the digital model of the sports article;

adjusting the digital model of the sports article in the digital environment to achieve an acceptable minimum distance between the part of the digital model of the body part and the second part of the digital model of the sports article; and selecting an optimized geometry of the second part of the digital model of the sports article based on the acceptable minimum distance between the part of the digital model of the body part and the second part of the digital model of the sports article, wherein producing the sports article is further based on the selected optimized geometry of the second part of the digital model of the sports article.

19. The method according to claim 15, wherein the digital model of the body part is based on a digital average of scans for at least two persons.

20. The method according to claim 19, wherein a template mesh is applied to the scans to compute averages of geometries corresponding to the scans to create the digital model of a body part.

\* \* \* \* \*